(12) United States Patent
Kusano et al.

(10) Patent No.: US 9,608,173 B2
(45) Date of Patent: Mar. 28, 2017

(54) LIGHT-EMITTING DEVICE

(75) Inventors: Tamio Kusano, Higashiomi (JP); Daisuke Sakumoto, Higashiomi (JP)

(73) Assignee: KYOCERA CORPORATION, Kyoto-Shi, Kyoto (JP)

( * ) Notice: Subject to any disclaimer, the term of this patent is extended or adjusted under 35 U.S.C. 154(b) by 550 days.

(21) Appl. No.: 12/597,729

(22) PCT Filed: Mar. 28, 2008

(86) PCT No.: PCT/JP2008/056216
§ 371 (c)(1),
(2), (4) Date: Feb. 12, 2013

(87) PCT Pub. No.: WO2008/136230
PCT Pub. Date: Nov. 13, 2008

(65) Prior Publication Data
US 2013/0175561 A1    Jul. 11, 2013

(30) Foreign Application Priority Data

Apr. 26, 2007    (JP) .................................. 2007-116904

(51) Int. Cl.
| | |
|---|---|
| *H01L 33/48* | (2010.01) |
| *H01L 33/50* | (2010.01) |
| *H01L 33/60* | (2010.01) |
| *H01L 33/44* | (2010.01) |

(52) U.S. Cl.
CPC .............. *H01L 33/50* (2013.01); *H01L 33/44* (2013.01); *H01L 33/48* (2013.01); *H01L 33/483* (2013.01); *H01L 33/60* (2013.01)

(58) Field of Classification Search
CPC ....... H01L 33/60; H01L 33/48; H01L 33/483; H01L 33/50; H01L 33/44

USPC .................................................... 257/98–100
See application file for complete search history.

(56) References Cited

U.S. PATENT DOCUMENTS

2009/0128912 A1*    5/2009    Okada et al. ................. 359/576

FOREIGN PATENT DOCUMENTS

| JP | 2003-037292 | 2/2003 |
|---|---|---|
| JP | 2004-296792 | 10/2004 |
| JP | 2005-051194 | 2/2005 |
| JP | 2006-303039 | 11/2006 |
| JP | 2007-095998 | 4/2007 |

(Continued)

OTHER PUBLICATIONS

Machine English translation of JP2006303039.*

(Continued)

*Primary Examiner* — Yu Chen
(74) *Attorney, Agent, or Firm* — Volpe and Koenig, P.C.

(57) ABSTRACT

The invention relates to reducing effect of light that is emitted from a light-emitting element and then enters between a base and a frame member. A light-emitting device (1) includes a base (11), a frame member (12) and a light-emitting element (13). The light-emitting device (1) further includes an intervening layer (14). The frame member (12) is disposed on the base (11). The light-emitting element (13) is made of a semiconductor material. The light-emitting element (13) is disposed in a region defined by the frame member (12), and mounted on the base (11). The intervening layer (14) contains a plurality of light transmitting particles (14-2) and is disposed between the base (11) and the frame member (12).

9 Claims, 4 Drawing Sheets

(56) References Cited

FOREIGN PATENT DOCUMENTS

WO     WO 2007032217 A1 * 3/2007

OTHER PUBLICATIONS

Machine English translation of JP2004296792.*
Machine English translation of JP2006303039, electrically obtained from JPO on Jun. 12, 2014.*
Machine English translation of JP2004296792, electrically obtained from JPO on Jun. 12, 2014.*

* cited by examiner

9,608,173 B2

LIGHT-EMITTING DEVICE

TECHNICAL FIELD

The present invention relates to a light-emitting device comprising a light-emitting element such as a light-emitting diode.

BACKGROUND ART

Recently, in a field of lighting, for example, development is in progress of light-emitting devices comprising a light-emitting element. A light-emitting element is a light-emitting diode made of a semiconductor material, for example. Some of the light-emitting devices include a base and a frame member. In the development of light-emitting devices, improvement in light-emitting property is required.
Patent document: JP-A 2003-37292.

DISCLOSURE OF THE INVENTION

In one aspect of the invention, a light-emitting device comprises a base, a frame member and a light-emitting element. The light-emitting device further comprises an intervening layer. The frame member is disposed on the base. The light-emitting element is made of a semiconductor material. The light-emitting element is disposed in a region defined by the frame member, and mounted on the base. The intervening layer contains a plurality of light transmitting particles, and is disposed between the base and the frame member.

In another aspect of the invention, a light-emitting device comprises a base, a light source and reflecting means. The light-emitting device further comprises an intervening layer. The light source is disposed on the base, and emits primary light. The reflecting means changes a direction of travel of part of the primary light. The intervening layer contains a plurality of light transmitting particles that absorb part of the primary light, and bonds the base and the reflecting means to each other.

According to the above-mentioned one aspect of the invention, since the light-emitting device comprises the intervening layer which contains the plurality of light transmitting particles and is disposed between the base and the frame member, effect by light that is emitted from the light-emitting element and then enters between the base and the frame member is reduced.

According to the above-mentioned another aspect of the invention, since the light-emitting device comprises the intervening layer which contains the plurality of light transmitting particles that absorb part of the primary light, effect by light that is emitted from the light-emitting element and then enters between the base and the frame member is reduced.

BRIEF DESCRIPTION OF THE DRAWINGS

Other and further objects, features, and advantages of the invention will be more explicit from the following detailed description taken with reference to the drawings wherein.

BEST MODE FOR CARRYING OUT THE INVENTION

Hereafter, a preferable embodiment of the invention will be described with reference to the drawings.

Figure 1:
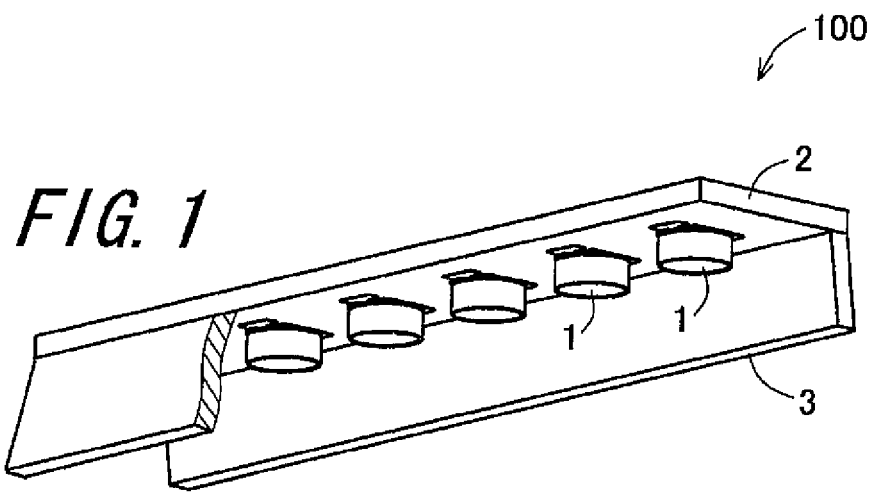
FIG. 1 shows a lighting apparatus 100 according to an aspect of the invention.

A lighting apparatus 100 according to an embodiment of the invention is shown in FIG. 1. The lighting apparatus 100 comprises a plurality of light-emitting devices 1, a base plate 2 and a reflecting element 3. The plurality of light-emitting devices 1 are mounted on the base plate 2 and disposed in a region defined by the reflecting member 3.

Figure 2:
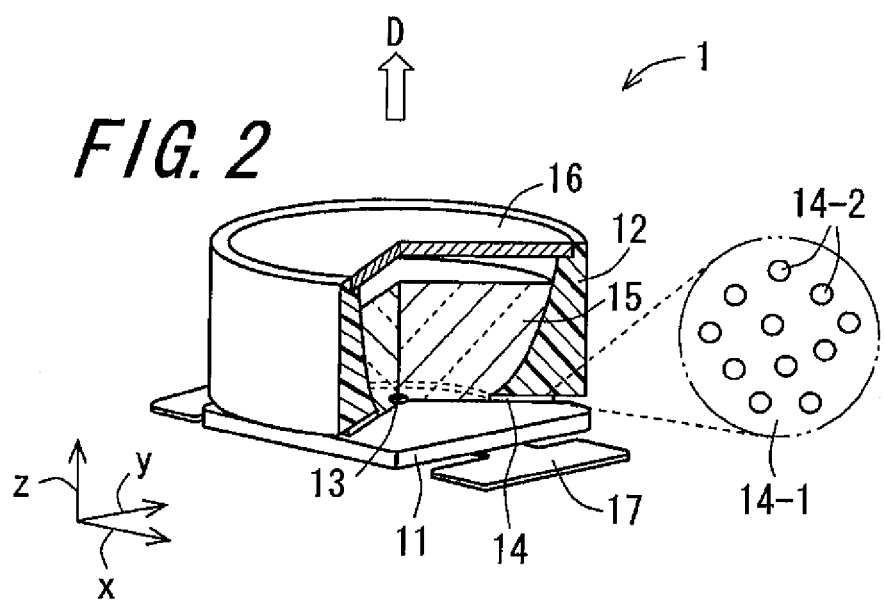
FIG. 2 shows a light-emitting device 1 shown in FIG. 1.

As shown in FIG. 2, the light-emitting device 1 comprises a base 11, a frame member 12 and a light-emitting element 13. The light-emitting device 1 further comprises an intervening layer 14, a sealing layer 15 and a light-emitting member 16.

In FIG. 2, the light-emitting device 1 is mounted on an xy-plane of an imaginary xyz-space. In FIG. 2, parts of a structure of the light-emitting device 1 are omitted in order to show an inner structure of the light-emitting device 1. Cross-sections of the omitted parts are indicated by means of hatching.

The base 11 is made of an insulating material. An example of insulating materials is ceramics. An example of ceramics is alumina. Another example of insulating materials is resin. An external terminal 17 is fixed to the base 11.

The frame member 12 is disposed on the base 11. The frame member 12 is made of an insulating material. An example of insulating materials is ceramics. An example of ceramics is alumina. Another example of insulating materials is resin. Another example of the material of the frame member 12 is a metal material. The frame member 12 is means for reflecting primary light emitted from the light-emitting element 13.

The light-emitting element 13 is mounted on the base 11, and disposed in a region defined by the frame member 12. "A region defined by the frame member 12" means a region in which the light-emitting element 13 is disposed such that light emitted from the light-emitting element 13 reaches the frame member 12. The light-emitting element 13 is surrounded by the frame member 12.

The light-emitting element 13 is a light-emitting diode (LED) made of a semiconductor material. The light-emitting element 13 is made of a plurality of semiconductor layers including an active layer. The light-emitting element 13 is a light source that emits primary light. The primary light is included in a wavelength region ranging from 210 nm to 500 nm or overlaps with the wavelength region.

Figure 3:
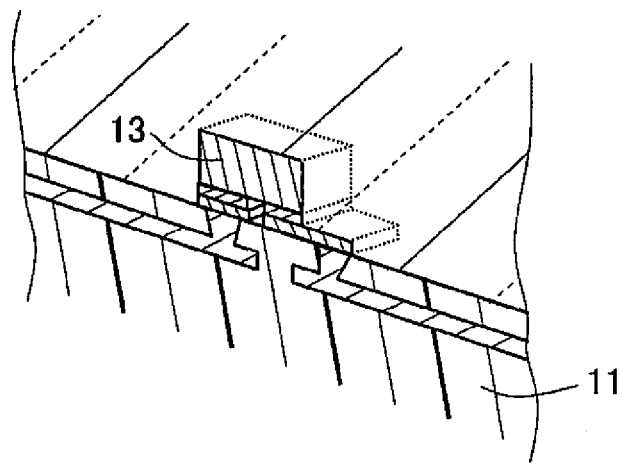
FIG. 3 shows a light-emitting element 13 shown in FIG. 2.

As shown in FIG. 3, The light-emitting element 13 is mounted on the base 11 by means of flip-chip connection. In FIG. 3, parts of structures of the base 11 and the light-emitting element 13 are omitted from the illustration. Cross-sections of the omitted parts are indicated by means of hatching.

Figure 4:
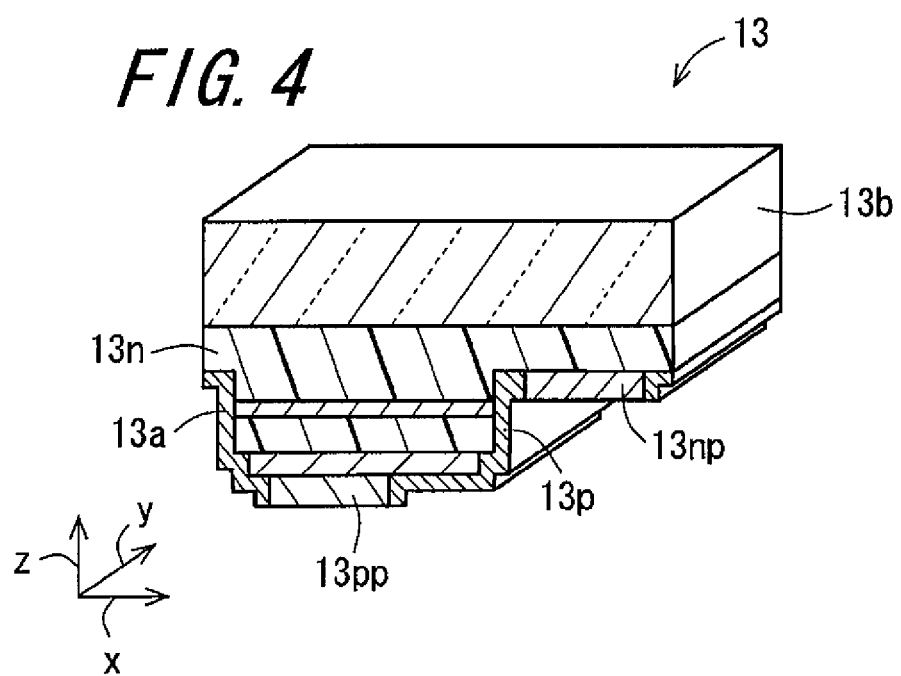
FIG. 4 shows a detailed structure of the light-emitting element 13.

As shown in FIG. 4, the light-emitting element 13 comprises a plurality of semiconductor layers 13n, 13a and 13p. In FIG. 4, the light-emitting element 13 is mounted on the xy-plane of the imaginary xyz-space. In FIG. 4, cross-sections are indicated by means of hatching.

The n-type semiconductor layer 13n and the p-type semiconductor layer 13p are stacked on a light transmitting substrate 13b. The semiconductor active layer 13a is formed between the n-type semiconductor layer 13n and the p-type semiconductor layer 13p. The light-emitting element 13 comprises electrodes 13pp and 13np. The p-side electrode 13pp is formed on the p-type semiconductor layer 13p. The n-side electrode 13np is formed on the n-type semiconductor layer 13n.

The intervening layer 14 is disposed between the base 11 and the frame member 12. The intervening layer 14 contains a matrix material 14-1 and a plurality of light transmitting particles 14-2. The intervening layer 14 is an adhesive that fixes the base 11 and the frame member 12. An example of the matrix material 14-1 is an acrylic resin. Light included in a UV wavelength region ranging from 210 nm to 400 nm or overlapping with the UV wavelength region is transmitted by the matrix material 14-1.

"Light transmitting" with respect to the particles 14 means that at least part of the light emitted from the light-emitting element 13 is transmitted by the particles. The plurality of light transmitting particles 14-2 are embedded in the matrix material 14-1. The plurality of light transmitting particles 14-2 are dispersed in the matrix material 14-1.

The light transmitting particles 14-2 are made of an inorganic material. Therefore, degradation of the light transmitting particles 14-2 due to the primary light emitted from the light-emitting element 13 is reduced. An example of inorganic materials is ceramics. An example of ceramics is alumina.

The light transmitting particles 14-2 have a refractive index that is greater than that of the matrix material 14-1. At least part of the light in the wavelength region ranging from 210 nm to 500 nm is transmitted by the light transmitting particles 14-2. Especially, at least part of the light in the UV wavelength region ranging from 210 nm to 400 nm is transmitted by the light transmitting particles 14-2.

Figure 5:
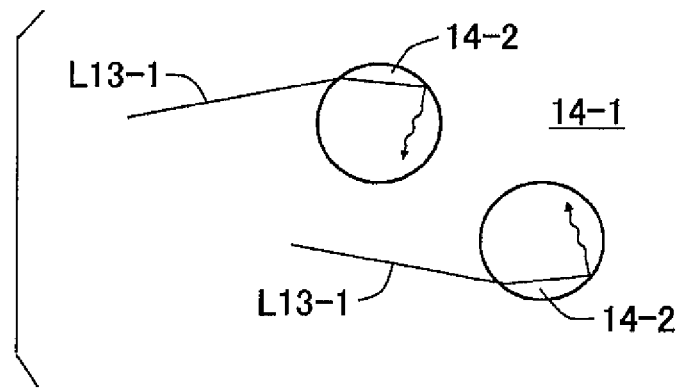
FIG. 5 shows how light L13-1 emitted from the light-emitting element 13 travels.

As shown in FIG. 5, part of the light L13-1 emitted from the light-emitting element 13 is transmitted by the matrix material 14-1 and enters the light transmitting particles 14-2. The light transmitting particles 14-2 have a refractive index greater than that of the matrix material 14-1. Therefore, within the light transmitting particles 14-2, part of the light L13-1 is totally reflected at an interface between the light transmitting particles 14-2 and the matrix material 14-1.

Within the light transmitting particles 14-2, the light L13-1 is totally reflected when it enters the interface at an incident angle greater than a critical angle. Assuming that the refractive index of the matrix material is $n_{14-1}$ and the refractive index of the light transmitting particles 14-2 is $n_{14-2}$, the critical angle $\theta$ is represented by the following formula.

$$\sin \theta = n_{14-1}/n_{14-2}$$

The totally reflected light L13-1 attenuates gradually within the light transmitting particles 14-2. Thus, light entering between the base 11 and the frame member 12 attenuates gradually due to the light transmitting particles 14-2. In the light-emitting device 1, effect by the light emitted from the light-emitting element 13 and then entering between the base 11 and the frame member 12 is reduced.

Degradation of properties of the matrix material 14-1 by the light L13-1 is reduced, due to the fact that the light L13-1 attenuates within the light transmitting particles 14-2. An amount of light L13-1 leaking through a gap between the base 11 and the frame member 12 is reduced, due to the fact that the light L13-1 attenuates.

It is preferable that a difference in refractive index between the light transmitting particles 14-2 and the matrix material 14-1 is equal to or greater than 0.2. Then, an amount of the light L13-1 attenuating within the light transmitting particles 14-2 becomes larger. Therefore, light-emitting property of the light-emitting device 1 is further improved.

The sealing layer 15 is attached to the light-emitting element 13. The sealing layer 15 is made of a light transmitting material. "Light transmitting" with respect to the sealing layer 15 means that at least part of the light emitted from the light-emitting element 13 is transmitted by the sealing layer.

The sealing layer 15 has a refractive index that is smaller than that of the matrix material 14-1. Therefore, part of light traveling in a direction from the matrix material 14-1 to the sealing layer 15 is totally reflected at an interface between the matrix material 14-1 and the sealing layer 15. Therefore, possibility is lowered that light that is emitted from the light-emitting element 13 and then changed in its wavelength by the matrix material 14-1 travels into the sealing layer 15. Thus, the light-emitting device 1 is improved regarding the light-emitting property.

The light-emitting member 16 is disposed on or above the light-emitting element 13. The light-emitting member 16 contains a fluorescence material, which emits secondary light with use of primary light. The light-emitting member 16 converts the wavelength of the primary light. The secondary light has a wavelength spectrum that is larger than that of the primary light.

Figure 6:
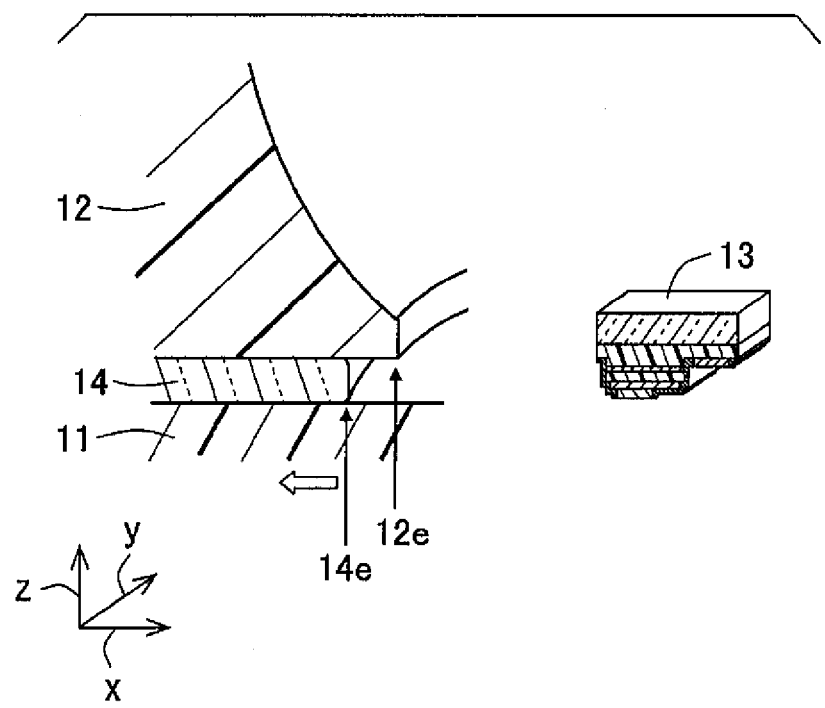
FIG. 6 shows a position of an end portion of an intervening layer 14.

As shown in FIG. 6, it is preferable that an inside end portion 14e of the intervening layer 14 is located outward than an end portion 12e of an inside surface of the frame member 12. In FIG. 6, "outward" means a negative direction along the x-axis in the imaginary xyz-space. An amount of the light that is emitted from the light-emitting element 13 and then enters the intervening layer 14 is reduced. Therefore, an amount of light that is attenuated by the light transmitting particles 14-2 is reduced. The light-emitting device 1 is improved regarding the light-emitting property, owing to the configurations described above.

Figure 7:
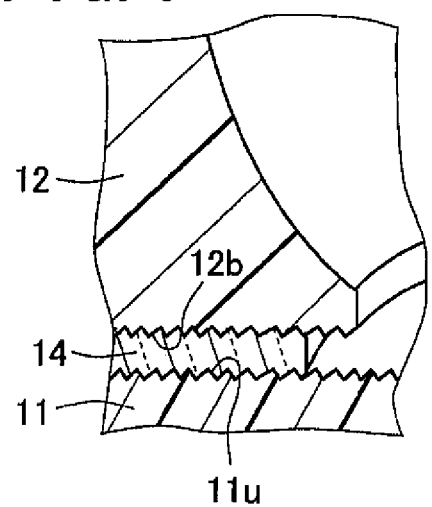
FIG. 7 shows a base 11 and a frame member.

In the base 11, it is preferable that a surface to which the intervening layer 14 is attached is porous. As shown in FIG. 7, a surface to which the intervening layer 14 is attached is a top surface 11u of the base 11. By the fact that the top surface 11u is porous, the matrix material of the intervening layer 14 intrudes into the base 11 at the top surface 11u. Therefore, even though the plurality of light transmitting particles 14-2 are contained in the intervening layer 14 which is an adhesive, bonding strength between the base 11 and the intervening layer 14 is enhanced.

In the frame member 12, it is preferable that a surface to which the intervening layer 14 is attached is porous. As shown in FIG. 7, a surface to which the intervening layer 14 is attached is a bottom surface 12b of the frame member 12. By the fact that the bottom surface 12b is porous, the matrix material of the intervening layer 14 intrudes into the frame member 12 at the bottom surface 12b. Therefore, even though the plurality of light transmitting particles 14-2 are contained in the intervening layer 14 which is an adhesive, bonding strength between the frame member 12 and the intervening layer 14 is enhanced.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

The invention claimed is:

1. A light-emitting device comprising:
a base;
a frame member disposed on the base;
a light-emitting element made of a semiconductor material, the light-emitting element being disposed in a region defined by the frame member, and mounted on the base, the light-emitting element emitting primary light;
an intervening layer containing a matrix material and a plurality of light transmitting particles embedded in the matrix material, the intervening layer being disposed between the base and the frame member;
a sealing layer made of a light transmitting material and attached to the light-emitting element, the sealing layer having a refractive index that is smaller than a refractive index of the matrix material; and
a light-emitting member containing a fluorescence material that is excited by the primary light so as to emit secondary light, the light-emitting member being disposed above the light-emitting element so as to be apart from an upper surface of the sealing layer upward,
wherein an inside end portion of the intervening layer is located farther away from the light-emitting element than an end portion of an inside surface of the frame member in a direction parallel to a surface of the base on which the light-emitting element is mounted, and
part of light traveling in a direction from the matrix material to the sealing layer is totally reflected at an interface between the matrix material and the sealing layer.

2. The light-emitting device of claim 1, wherein the plurality of light transmitting particles have a refractive index that is greater than a refractive index of the matrix material.

3. The light-emitting device of claim 2, wherein a difference in refractive index between the plurality of the light transmitting particles and the matrix material is equal to or greater than 0.2.

4. The light-emitting device of claim 1, wherein the matrix material transmits light in a UV wavelength region of 400 nm or shorter.

5. The light-emitting device of claim 1, wherein the light-emitting element emits primary light overlapping with a wavelength region ranging from 210 nm to 500 nm.

6. The light-emitting device of claim 5, wherein the light transmitting particles are made of an inorganic material.

7. The light-emitting device of claim 6, wherein the inorganic material is alumina.

8. A light-emitting device comprising:
a base;
a light source disposed on the base and emits primary light;
reflecting means for changing a direction of travel of part of the primary light;
an intervening layer containing a matrix material and a plurality of light transmitting particles that is embedded in the matrix material and absorb part of the primary light, the intervening layer bonding the base and the reflecting means to each other;
a sealing layer made of a light transmitting material and attached to the light source, the sealing layer having a refractive index that is smaller than a refractive index of the matrix material; and
wavelength converting means that emits secondary light in response to the primary light, the wavelength converting means being disposed above the light source so as to be apart from an upper surface of the sealing layer upward,
wherein an inside end portion of the intervening layer is located farther away from the light source than an end portion of an inside surface of the reflecting means in a direction parallel to a surface of the base on which the light source is disposed, and
part of light traveling in a direction from the matrix material to the sealing layer is totally reflected at an interface between the matrix material and the sealing layer.

9. The light-emitting device of claim 8, wherein the plurality of light transmitting particles absorb light included in a UV wavelength region of 400 nm or shorter.

* * * * *